US012785658B2

(12) United States Patent
Yamaguchi et al.

(10) Patent No.: US 12,785,658 B2
(45) Date of Patent: Nov. 3, 2026

(54) MANUFACTURING METHOD FOR VIBRATOR ELEMENT

(71) Applicant: SEIKO EPSON CORPORATION, Tokyo (JP)

(72) Inventors: Keiichi Yamaguchi, Ina (JP); Hiyori Sakata, Shinagawa (JP); Shigeru Shiraishi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 703 days.

(21) Appl. No.: 18/446,526

(22) Filed: Aug. 9, 2023

(65) Prior Publication Data

US 2024/0056053 A1 Feb. 15, 2024

(30) Foreign Application Priority Data

Aug. 10, 2022 (JP) ................................ 2022-127731

(51) Int. Cl.
*H03H 9/215* (2006.01)
*H03H 3/02* (2006.01)

(52) U.S. Cl.
CPC .............. *H03H 9/215* (2013.01); *H03H 3/02* (2013.01); *H03H 2003/026* (2013.01)

(58) Field of Classification Search
CPC ..... H03H 9/215; H03H 3/02; H03H 2003/026
See application file for complete search history.

(56) References Cited

U.S. PATENT DOCUMENTS

2009/0077781 A1* 3/2009 Amano .................. H10N 30/06 29/25.35
2013/0167341 A1* 7/2013 Kawashima ............. H03B 5/32 29/25.35

FOREIGN PATENT DOCUMENTS

JP 2007-013382 A 1/2007
JP 2008-205657 A 9/2008
JP 2013-175933 A 9/2013
JP 2018-148380 A 9/2018

* cited by examiner

*Primary Examiner* — Emily P Pham
(74) *Attorney, Agent, or Firm* — Harness, Dickey & Pierce, P.L.C.

(57) ABSTRACT

A manufacturing method for a vibrator element includes a preparation step of preparing a quartz crystal substrate having a first substrate surface and a second substrate surface, a first protective film formation step of forming a first protective film in first groove formation areas of the first substrate surface, a second protective film formation step of forming a second protective film in an area except the first groove formation areas of a first vibrating arm formation area and a second vibrating arm formation area of the first substrate surface, and a first dry etching step of dry etching the quartz crystal substrate from the first substrate surface side via the first protective film and the second protective film and forming a first surface, first grooves, and outer shapes of the first vibrating arm and the second vibrating arm, wherein r1>r2, where an etching rate of the first protective film is r1 and an etching rate of the second protective film is r2.

14 Claims, 21 Drawing Sheets

MANUFACTURING METHOD FOR VIBRATOR ELEMENT

The present application is based on, and claims priority from JP Application Serial Number 2022-127731, filed Aug. 10, 2022, the disclosure of which is hereby incorporated by reference herein in its entirety.

BACKGROUND

1. Technical Field

The present disclosure relates to a manufacturing method for a vibrator element.

2. Related Art

JP-A-2013-175933 discloses a method of forming a tuning fork-type vibrator having grooves with bottoms in vibrating arms by wet etching and dry etching. In the manufacturing method, the outer shape of the tuning fork-type vibrator is formed by wet etching of a quartz crystal substrate, and then, the grooves are formed by dry etching.

JP-A-2007-013382 discloses a method of forming a tuning fork-type vibrator having grooves with bottoms in vibrating arms by dry etching. In the manufacturing method, when a substrate of a piezoelectric material is dry-etched, the widths of the grooves are made narrower than the distance between the pair of vibrating arms, thereby, the etching depth of the grooves is made shallower than the etching depth between the pair of vibrating arms using the micro-loading effect, and the grooves and the outer shape of the vibrator are collectively formed.

However, in the manufacturing method of JP-A-2013-175933, the wet etching for forming the outer shape and the dry etching for forming the grooves are respectively separate steps, and the manufacturing process is complex and the grooves tend to be displaced relative to the outer shape. Therefore, the vibrator element according to the manufacturing method has a problem that unnecessary vibration or the like tends to occur.

On the other hand, in the manufacturing method of JP-A-2007-013382, the outer shape and the grooves are collectively formed at the same step, and the above described problem does not occur. However, in the manufacturing method, the outer shape and the grooves are collectively formed using the micro-loading effect in the dry etching, and there is a problem that settings of dimensions including the widths of the vibrating arms and the widths and depths of the grooves are restricted and the degree of freedom of design is lower.

Accordingly, a manufacturing method for the vibrating element that enables collective formation of the outer shape and the grooves and has a higher degree of freedom of design is required.

SUMMARY

A manufacturing method for a vibrator element is a manufacturing method for a vibrator element including a first vibrating arm and a second vibrating arm extending along a first direction and arranged along a second direction crossing the first direction, the first vibrating arm and the second vibrating arm respectively having a first surface and a second surface along the first direction and the second direction in a front-back relationship and first grooves having bottoms and opening in the first surface, including a preparation step of preparing a quartz crystal substrate having a first substrate surface and a second substrate surface in a front-back relationship, a first protective film formation step of forming a first protective film in first groove formation areas where the first grooves are formed of the first substrate surface, a second protective film formation step of forming a second protective film in an area except the first groove formation areas of a first vibrating arm formation area where the first vibrating arm is formed and a second vibrating arm formation area where the second vibrating arm is formed of the first substrate surface, and a first dry etching step of dry etching the quartz crystal substrate from the first substrate surface side via the first protective film and the second protective film and forming the first surface, the first grooves, and outer shapes of the first vibrating arm and the second vibrating arm, wherein r1>r2, where an etching rate of the first protective film is r1 and an etching rate of the second protective film is r2.

BRIEF DESCRIPTION OF THE DRAWINGS

FIG. 2 is a sectional view along line A1-Al in

DESCRIPTION OF EMBODIMENTS

1. First Embodiment

A manufacturing method for a vibrator element 1 according to a first embodiment will be explained. First, a configuration of the vibrator element 1 will be explained with reference to FIGS. 1 and 2, and then, the manufacturing method for the vibrator element 1 will be explained with reference to FIGS. 3 to 13.

Figure 3:
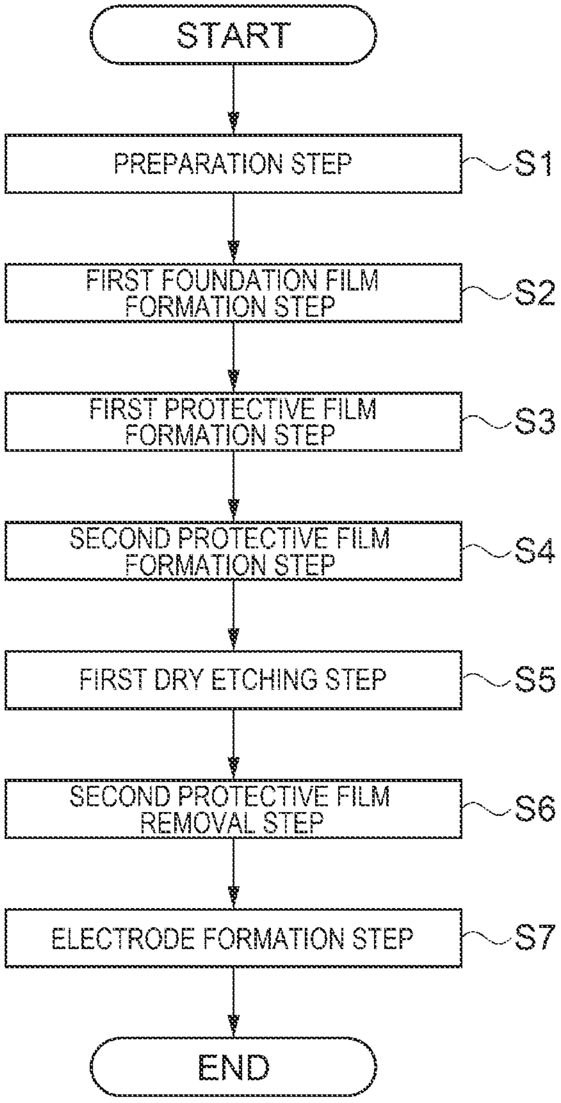
FIG. 3 is a flowchart showing a manufacturing method for the vibrator element according to the first embodiment.
Figure 5:
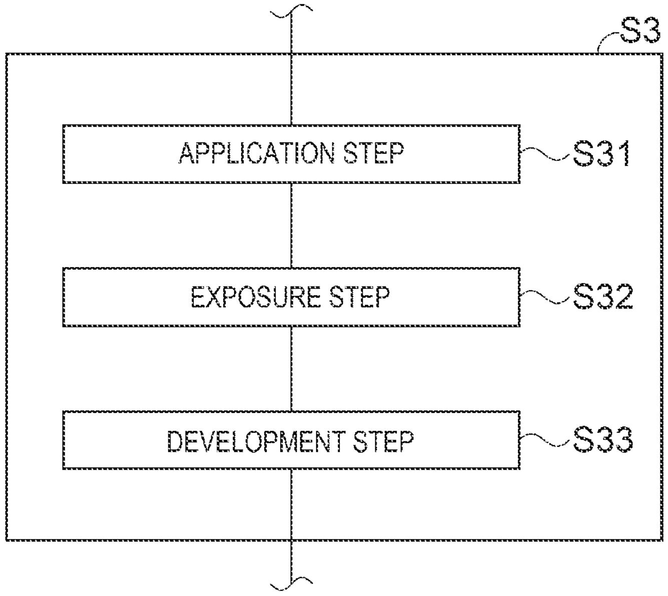
FIG. 5 is a flowchart showing a formation process of a first protective film.
Figure 24:
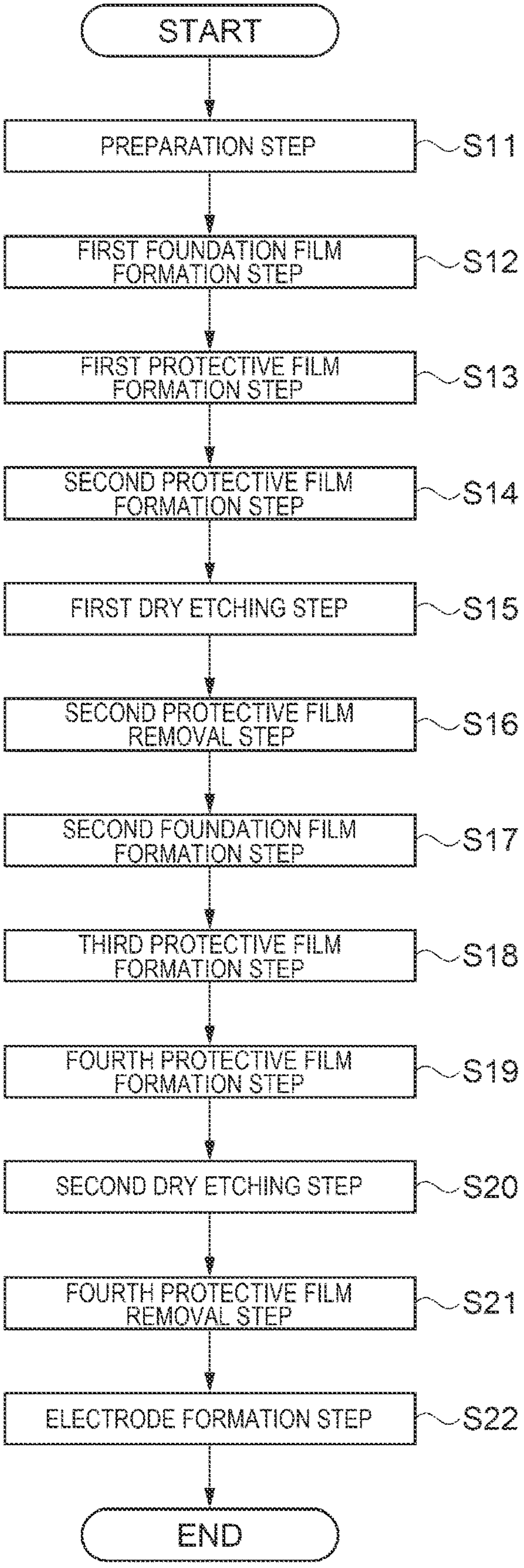
FIG. 24 is a flowchart showing a manufacturing method for the vibrator element according to the second embodiment.

For convenience of explanation, an X-axis, a Y-axis, and a Z-axis are shown as three axes orthogonal to one another in the respective drawings except FIGS. 3, 5, and 24. Further, a direction along the X-axis is referred to as "X direction", a direction along the Y-axis is referred to as "Y direction", and a direction along the Z-axis is referred to as "Z direction". The pointer sides of the respective axes are also referred to as "plus side" and the opposite sides to the pointers are also referred to as "minus side". The plus side in the Z direction is also referred to as "upper" and the minus side in the Z direction is also referred to as "lower". In this specification, a first direction is the Y direction and a second direction is the X direction.

1.1. Vibrator Element

Figure 1:
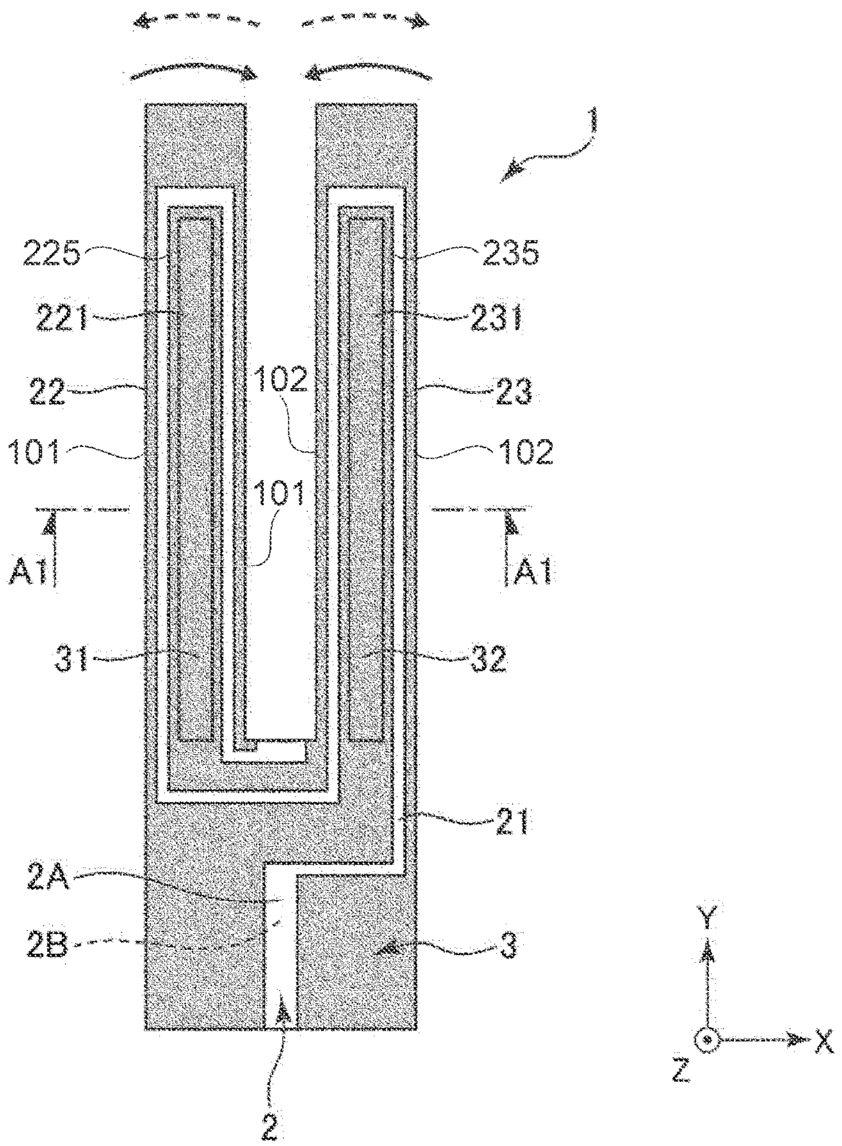
FIG. 1 is a plan view showing a configuration of a vibrator element according to a first embodiment.
Figure 2:
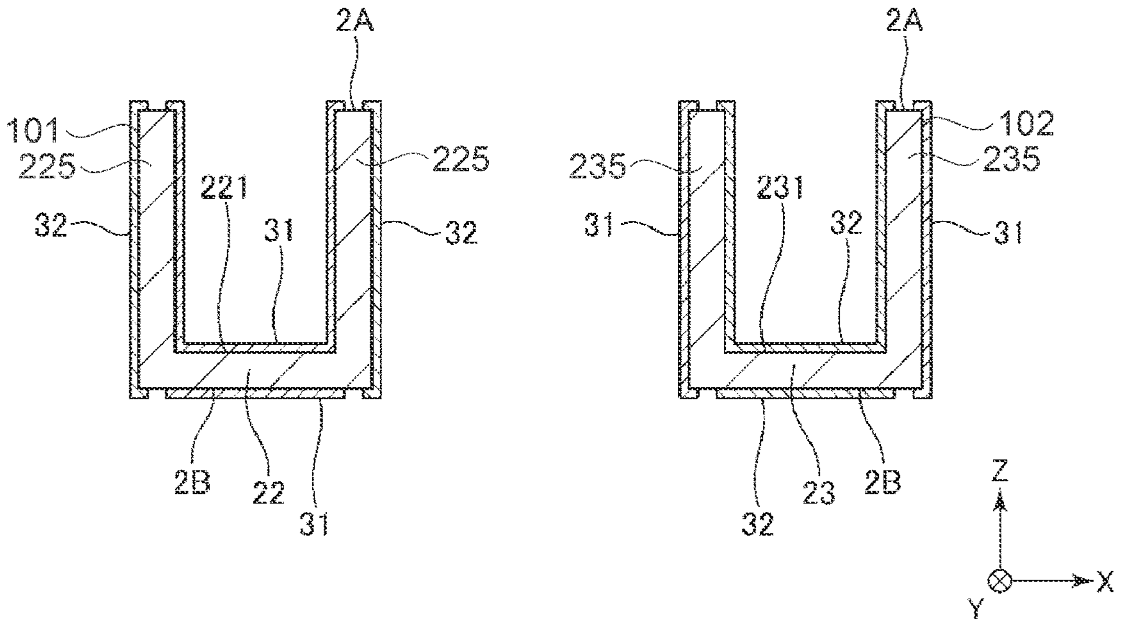

As shown in FIGS. 1 and 2, the vibrator element 1 of the embodiment is a tuning fork-type vibrator element and has a vibrating substrate 2 and an electrode 3 formed on the surface of the vibrating substrate 2.

The vibrating substrate 2 is formed by patterning of a Z cut quartz crystal substrate in a desired shape, has a breadth along the XY-plane defined by the X-axis and the Y-axis as crystal axes of the quartz crystal, and has a thickness along the Z direction. The X-axis is also referred to as "electrical axis", the Y-axis is also referred to as "mechanical axis", and the Z-axis is also referred to as "optical axis".

The vibrating substrate 2 has a plate-like shape and has a first surface 2A and a second surface 2B in a front-back relationship with each other arranged in the Z direction. Further, the vibrating substrate 2 has a base portion 21, and a first vibrating arm 22 and a second vibrating arm 23 extending from the base portion 21 along the Y direction as the first direction and arranged along the X direction as the second direction crossing the first direction.

The first vibrating arm 22 has a first groove 221 having a bottom and opening in the first surface 2A, first bank portions 225 defining the first groove 221, and side surfaces 101 coupling the first surface 2A and the second surface 2B. The first bank portions 225 are portions arranged with the first groove 221 in between along the X direction in the first surface 2A in a plan view.

Similarly, the second vibrating arm 23 has a first groove 231 having a bottom and opening in the first surface 2A, first bank portions 235 defining the first groove 231, and side surfaces 102 coupling the first surface 2A and the second surface 2B. The first bank portions 235 are portions arranged with the first groove 231 in between along the X direction in the first surface 2A in the plan view.

The first grooves 221, 231 respectively extend along the Y direction. Further, the first bank portions 225, 235 are respectively formed on both sides in the X direction of the first grooves 221, 231 and extend along the Y direction. Therefore, the first vibrating arm 22 and the second vibrating arm 23 respectively have cross-sectional shapes substantially in U-shapes. Thereby, the vibrator element 1 having a reduced thermoelastic loss and excellent vibration characteristics is obtained.

The electrode 3 has signal electrodes 31 and ground electrodes 32. The signal electrodes 31 are placed on the first surface 2A and the second surface 2B of the first vibrating arm 22 and the side surfaces 102 of the second vibrating arm 23. On the other hand, the ground electrodes 32 are placed on the side surfaces 101 of the first vibrating arm 22 and the first surface 2A and the second surface 2B of the second vibrating arm 23. When drive signals are applied to the signal electrodes 31 with the ground electrodes 32 grounded, as shown by arrows in FIG. 1, the first vibrating arm 22 and the second vibrating arm 23 flexurally vibrate in the X direction to be repeatedly closer to and away from each other.

1.2. Manufacturing Method for Vibrator Element

Next, the manufacturing method for the vibrator element 1 is explained. As shown in FIG. 3, the manufacturing method for the vibrator element 1 includes a preparation step S1, a first foundation film formation step S2, a first protective film formation step S3, a second protective film formation step S4, a first dry etching step S5, a second protective film removal step S6, and an electrode formation step S7.

1.2.1. Preparation Step S1

First, a quartz crystal substrate 20 as a parent material of the vibrating substrate 2 is prepared. From the quartz crystal substrate 20, a plurality of vibrator elements 1 are collectively formed. The quartz crystal substrate 20 has a plate-like shape and has a first substrate surface 20A and a second substrate surface 20B in a front-back relationship with each other and arranged in the Z direction. By abrasive processing including lapping and polishing, the quartz crystal substrate 20 is adjusted in a desired thickness and the first substrate surface 20A and the second substrate surface 20B are sufficiently smoothed. Further, as necessary, surface treatment by wet etching may be performed on the quartz crystal substrate 20.

1.2.2. First Foundation Film Formation Step S2

Figure 4:
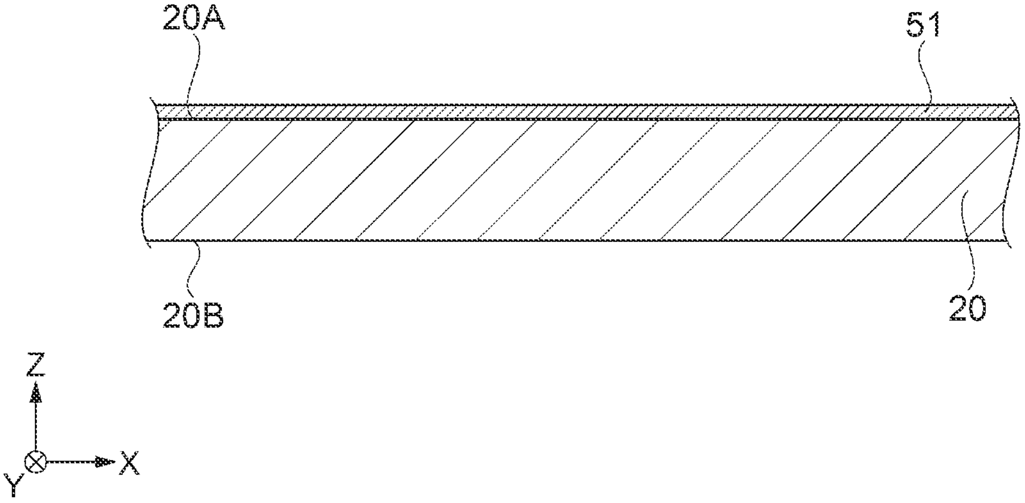
FIG. 4 is a sectional view for explanation of the manufacturing method for the vibrator element.

Then, as shown in FIG. 4, a foundation film 51 as a metal material such as chromium (Cr) is formed on the first substrate surface 20A of the vibrating substrate 2. Note that the thickness of the foundation film 51 is smaller than thicknesses of a first protective film 52 and a second protective film 53, which will be described later. Further, in the embodiment, the foundation film 51 is formed only on the first substrate surface 20A of the vibrating substrate 2, however, may be formed on the second substrate surface 20B and the side surfaces of the vibrating substrate 2.

1.2.3. First Protective Film Formation Step S3

The first protective film 52 as a resin material such as a resist is formed on the foundation film 51 formed on the first substrate surface 20A of the vibrating substrate 2. Note that, as shown in FIG. 5, the first protective film formation step S3 includes an application step S31 of applying the first protective film 52, an exposure step S32 exposing the first protective film 52 to light, and a development step S33 of developing the first protective film 52 exposed to light.

Figure 6:
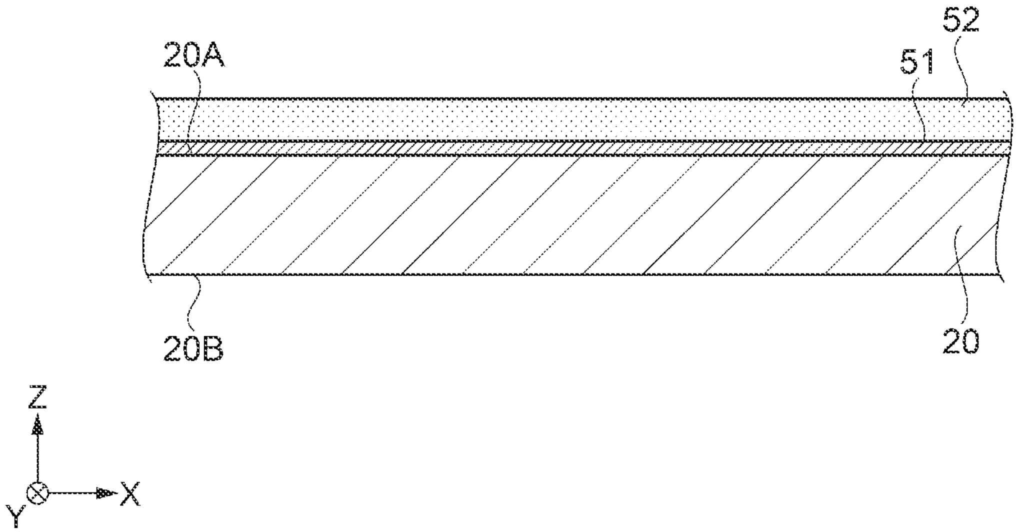
FIG. 6 is a sectional view for explanation of the manufacturing method for the vibrator element.

At the application step S31, as shown in FIG. 6, the first protective film 52 is applied in a predetermined thickness onto the foundation film 51 formed on the first substrate surface 20A of the quartz crystal substrate 20. Note that, in the embodiment, the first protective film 52 is a positive photoresist, but may be a negative photoresist. As a method of applying the first protective film 52, e.g., spin coating, spray coating, or the like may be used.

Then, at the exposure step S32, a light output from an exposure device is radiated to the first protective film 52 applied onto the foundation film 51 formed on the first substrate surface 20A of the quartz crystal substrate 20.

Figure 7:
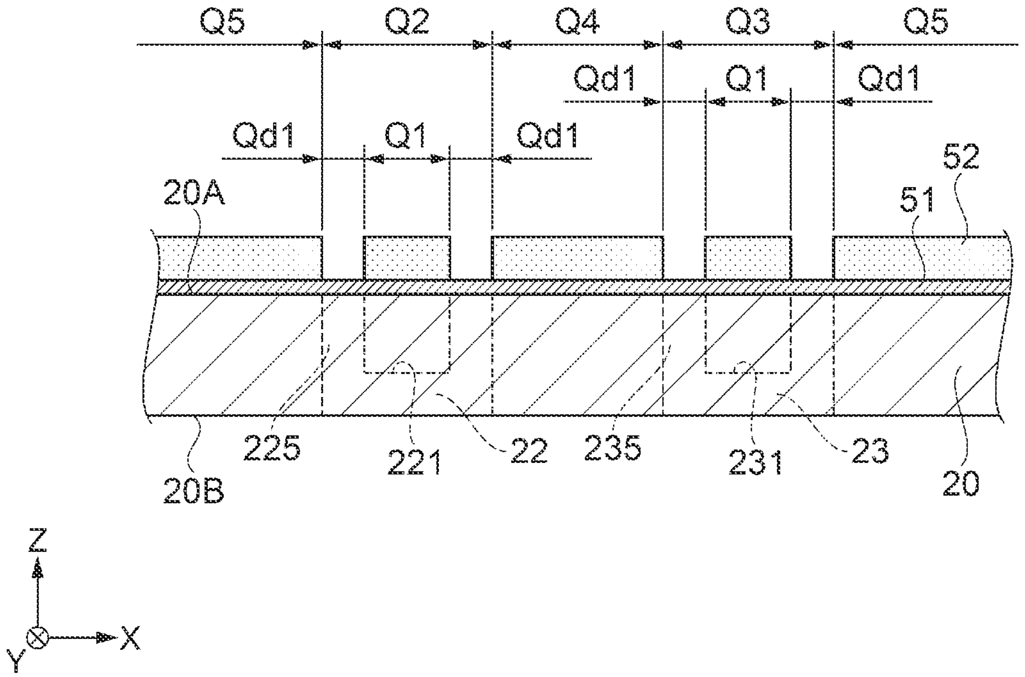
FIG. 7 is a sectional view for explanation of the manufacturing method for the vibrator element.

Then, at the development step S33, the first protective film 52 applied onto the foundation film 51 formed on the first substrate surface 20A of the quartz crystal substrate 20 is developed. Thereby, as shown in FIG. 7, the first protective film 52 in first bank portion formation areas Qd1 where the first bank portions 225, 235 are formed is developed and removed. Further, the first protective film 52 is formed in first groove formation areas Q1 where the first grooves 221, 231 are formed, first vibrating arm formation areas Q2 where the first vibrating arms 22 are formed, second vibrating arm formation areas Q3 where the second vibrating arms 23 are formed, inter-arm areas Q4 between the first vibrating arm 22 and the second vibrating arm 23, and inter-element areas Q5 between the adjacent elements. Note that, in FIG. 7, to clearly show the respective areas, the first vibrating arm 22, the second vibrating arm 23, the first grooves 221, 231, and the first bank portions 225, 235 in the finished vibrating substrate 2 are shown by broken lines.

1.2.4. Second Protective Film Formation Step S4

Figure 8:
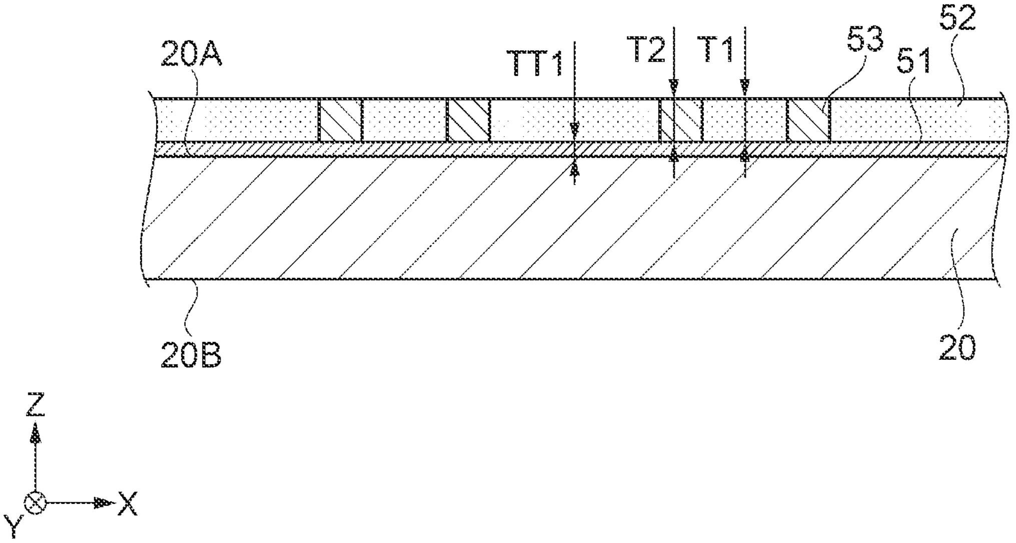
FIG. 8 is a sectional view for explanation of the manufacturing method for the vibrator element.

Then, as shown in FIG. 8, the second protective film 53 as a metal material such as copper (Cu) or nickel (Ni) is formed by plating in the first bank portion formation areas Qd1 with the first protective film 52 removed. Note that, as a method of forming the second protective film 53, e.g., a method of depositing the second protective film 53 by evaporation or sputtering and forming by a photolithography technique may be used.

Here, a thickness TT1 of the foundation film 51 is smaller than a thickness T1 of the first protective film 52 and a thickness T2 of the second protective film 53. The thickness TT1 of the foundation film 51 is made smaller, and thereby, at the first dry etching step S5, which will be described later, dry etching in the inter-arm areas Q4 and the inter-element areas Q5 may be performed at the maximum speed, and the time for dry etching may be shortened and the time for the dry etching step may be shortened.

Figure 9:
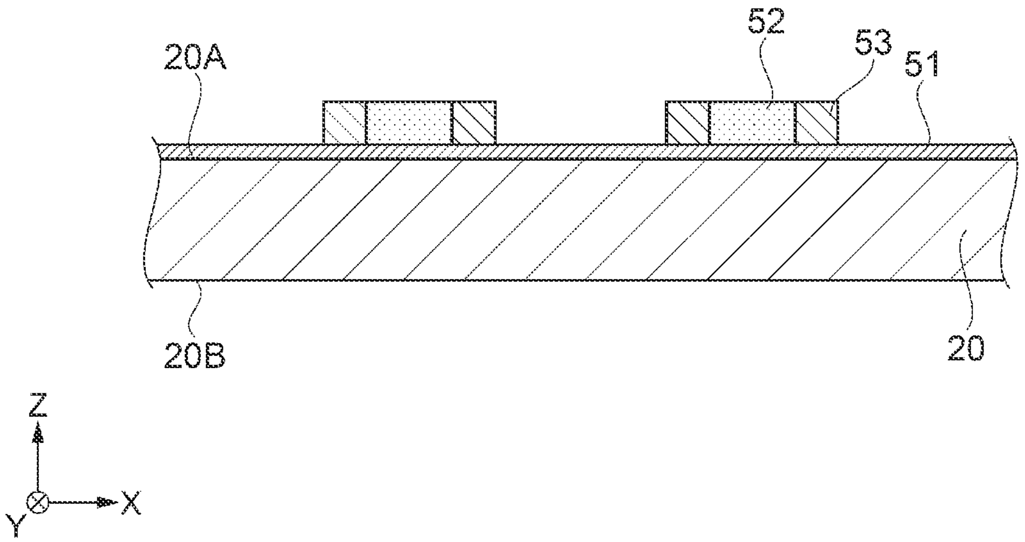
FIG. 9 is a sectional view for explanation of the manufacturing method for the vibrator element.

Then, as shown in FIG. 9, the first protective film 52 in the inter-arm areas Q4 and the inter-element areas Q5 is exposed to light, developed, and removed.

1.2.5. First Dry Etching Step S5

Figure 10:
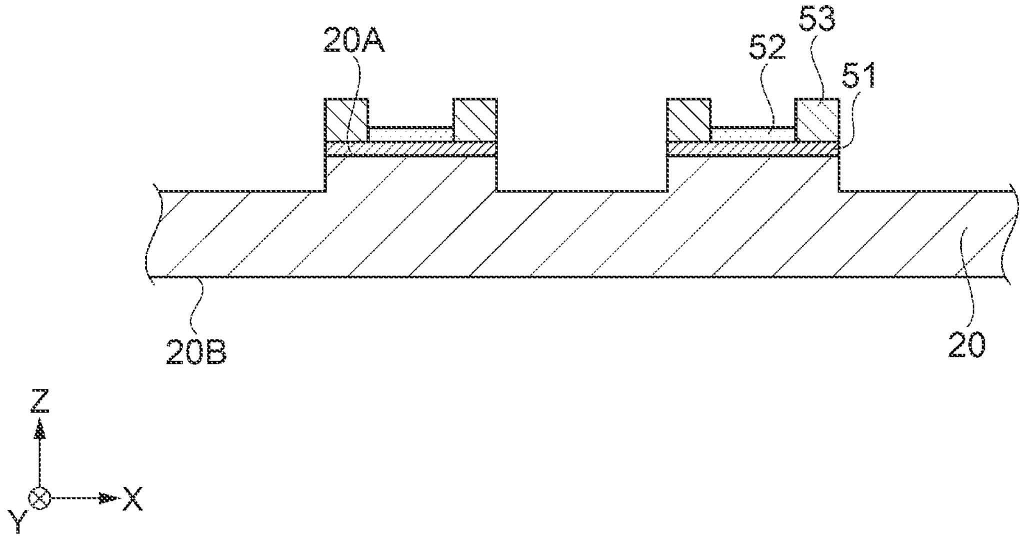
FIG. 10 is a sectional view for explanation of the manufacturing method for the vibrator element.
Figure 11:
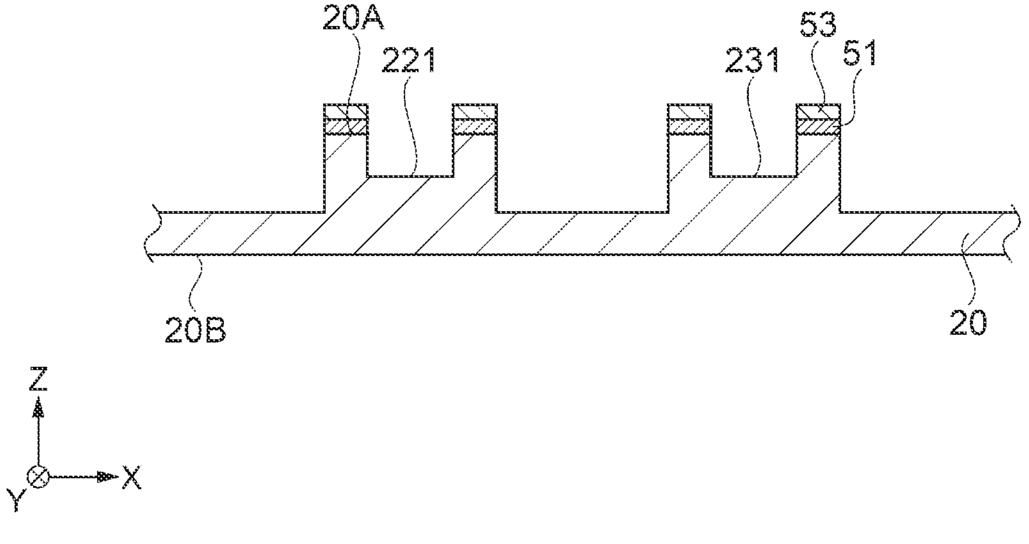
FIG. 11 is a sectional view for explanation of the manufacturing method for the vibrator element.
Figure 12:
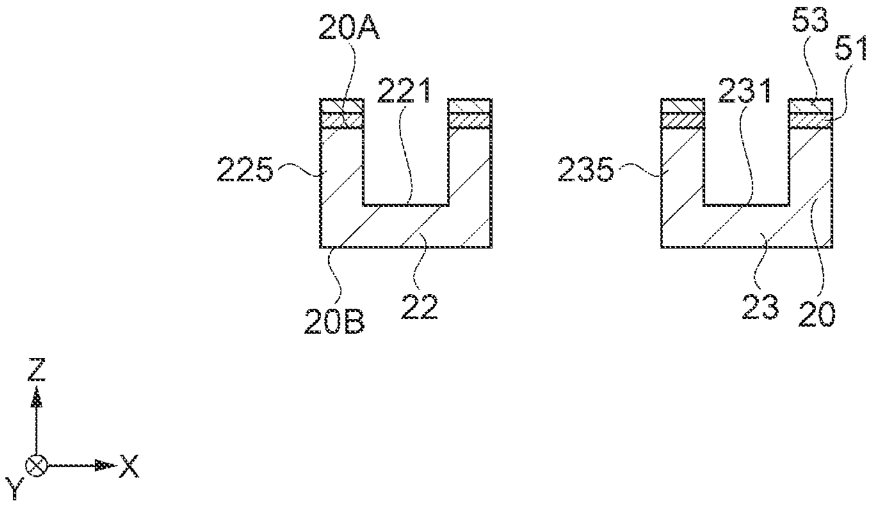
FIG. 12 is a sectional view for explanation of the manufacturing method for the vibrator element.

As shown in FIGS. 10 to 12, the quartz crystal substrate 20 is dry-etched from the first substrate surface 20A side via the first protective film 52 and the second protective film 53 formed in the first vibrating arm formation areas Q2 and the second vibrating arm formation areas Q3, and the first grooves 221, 231 and the outer shape of the vibrating substrate 2 are formed at the same time. The outer shape of the vibrating substrate 2 includes outer shapes of the first vibrating arm 22 and the second vibrating arm 23. Note that "formed at the same time" refers to both collectively formed at a single step. More specifically, the step is reactive ion etching and performed using a reactive ion etching device (RIE device). Further, a reaction gas introduced into the RIE device is not particularly limited, but e.g., $SF_6$, $CF_4$, $C_2F_4$, $C_2F_6$, $C_3F_6$, $C_4F_8$, or the like may be used.

When dry etching is started, first, as shown in FIG. 10, the foundation film 51 in the inter-arm areas Q4 and the inter-element areas Q5 and the quartz crystal substrate 20 are etched and the thickness of the quartz crystal substrate 20 becomes smaller. Further, the first protective film 52 formed in the first groove formation areas Q1 is etched and the thickness of the first protective film 52 becomes smaller. Note that the second protective film 53 in the first bank portion formation areas Qd1 is also etched, however, an etching rate r2 of the second protective film 53 is smaller than an etching rate r1 of the first protective film 52. That is, a relationship r1>r2 is satisfied and the second protective film 53 is etched at a lower speed than the first protective film 52. Accordingly, the thickness of the first protective film 52 becomes smaller than the thickness of the second protective film 53.

Then, the dry etching progresses and, as shown in FIG. 11, the quartz crystal substrate 20 in the inter-arm areas Q4 and the inter-element areas Q5 is etched and the thickness of the quartz crystal substrate 20 becomes even smaller. Further, the first protective film 52 and the foundation film 51 formed in the first groove formation areas Q1 are etched, further, the quartz crystal substrate 20 in the first groove formation areas Q1 is etched, and the thickness of the quartz crystal substrate 20 becomes smaller.

As shown in FIG. 12, the dry etching is ended with the second protective film 53 left. Note that, at the end of the dry etching, the quartz crystal substrate 20 in the inter-arm areas Q4 and the inter-element areas Q5 is no longer etched and the outer shape of the vibrating substrate 2 is formed. Further, the quartz crystal substrate 20 in the first groove formation areas Q1 is etched, the thickness of the quartz crystal substrate 20 becomes even smaller, and the first vibrating arm 22 having the first groove 221 and the first bank portion 225 and the second vibrating arm 23 having the first groove 231 and the first bank portion 235 are formed.

Therefore, at the step, the first grooves 221, 232 and the outer shape of the vibrating substrate 2 may be formed at the same time.

1.2.6. Second Protective Film Removal Step S6

Figure 13:
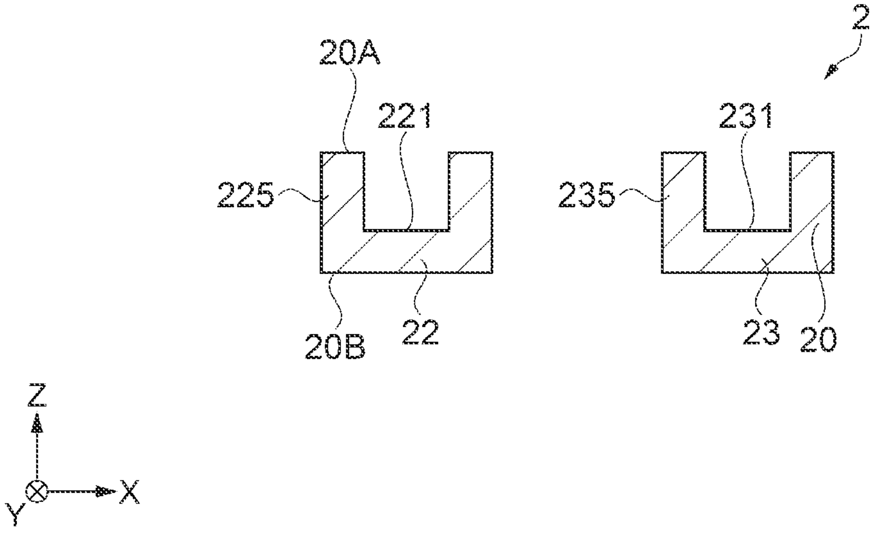
FIG. 13 is a sectional view for explanation of the manufacturing method for the vibrator element.

As shown in FIG. 13, the second protective film 53 and the foundation film 51 left on the first substrate surface 20A of the quartz crystal substrate 20 in the first bank portion formation areas Qd1 are removed. Thereby, the first substrate surface 20A of the quartz crystal substrate 20 becomes the first surfaces 2A of the first vibrating arm 22 and the second vibrating arm 23. That is, the first surfaces 2A of the first vibrating arm 22 and the second vibrating arm 23 are not etched at the first dry etching step S5, and the thicknesses of the first vibrating arm 22 and the second vibrating arm 23 in the first bank portion formation areas Qd1 and the surface roughness of the first surfaces 2A are maintained without change from the thickness of the quartz crystal substrate 20 and the surface roughness of the first substrate surface 20A. Accordingly, the thickness accuracy of the first vibrating arm 22 and the second vibrating arm 23 is increased and unnecessary vibration including torsional vibration may be suppressed.

1.2.7. Electrode Formation Step S7

A metal film is deposited on the surface of the vibrating substrate 2 and the metal film is patterned, and thereby, the electrode 3 is formed.

In the above described manner, the vibrator element 1 of the embodiment is obtained.

Note that, in the embodiment, the first protective film 52 is the resin material and the second protective film 53 is the metal material, however, the first protective film 52 and the second protective film 53 may be formed of resin materials. Or, the first protective film 52 and the second protective film 53 may be formed of metal materials. When one of the first protective film 52 and the second protective film 53 is formed of a resin material, the other may be formed of a metal material. Note that it is necessary to satisfy the relationship r1>r2 when the etching rate of the first protective film 52 is r1 and the etching rate of the second protective film 53 is r2. As described above, in the manufacturing method for the vibrator element 1 of the embodiment, the first protective film 52 having the larger etching rate than the second protective film 53 is placed in the first groove formation areas Q1 and the second protective film 53 is placed in the first bank portion formation areas Qd1, and thereby, at the first dry etching step S5, the outer shape of the vibrating substrate 2 including the first vibrating arm 22 and the second vibrating arm 23 and the first grooves 221, 231 may be collectively formed without using the micro-loading effect. Accordingly, the manufacturing steps for the vibrator element 1 may be reduced and the cost of the vibrator element 1 may be reduced. Further, displacement of the first grooves 221, 231 relative to the outer shape may be prevented and the formation accuracy of the vibrating substrate 2 is increased.

The first protective film 52 for forming the first grooves 221, 231 and the second protective film 53 for forming the outer shape of the vibrating substrate 2 including the first vibrating arm 22 and the second vibrating arm 23 are used, and thereby, the dimensions of the first grooves 221, 231, the first vibrating arm 22 and the second vibrating arm 23, etc. may be controlled and settings of the dimensions including the width in the X direction in the inter-arm area Q4, the width in the X direction in the inter-element area Q5, the widths in the X direction in the first vibrating arm 22 and the second vibrating arm 23, and the widths in the X direction in the first grooves 221, 231 are not restricted, and the manufacturing method for the vibrator element 1 having a higher degree of freedom of design may be provided.

1.3. Modified Examples

The vibrator element manufactured by the manufacturing method for the vibrator element of the present disclosure is not particularly limited.

1.3.1. First Modified Example

Figure 14:
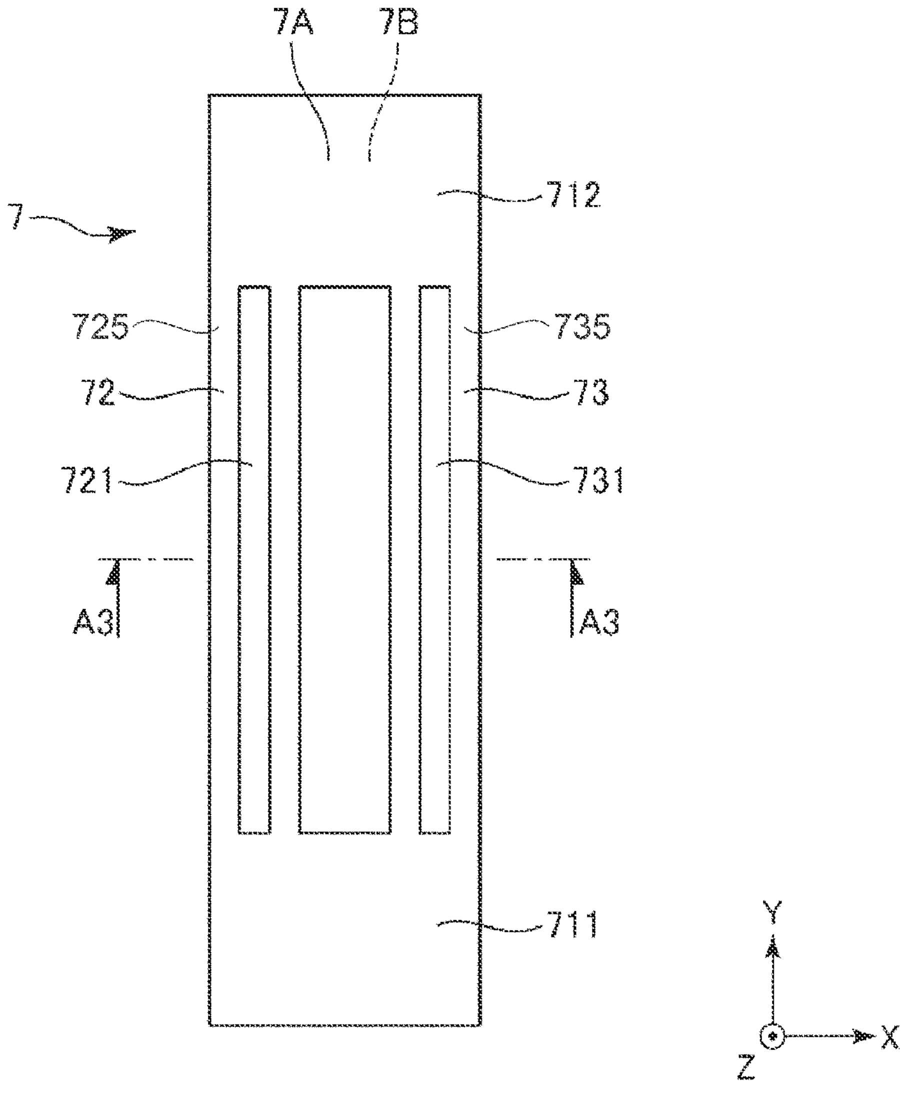
FIG. 14 is a plan view showing a first modified example of the vibrator element.
Figure 15:
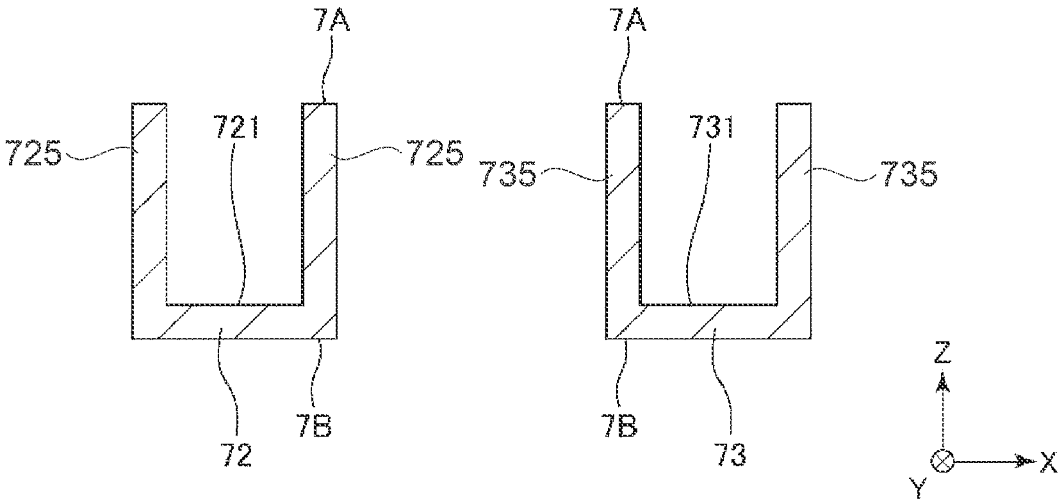
FIG. 15 is a sectional view along line A3-A3 in FIG. 14.

A vibrator element of a first modified example manufactured by the manufacturing method for the vibrator element of the present disclosure may be e.g., a double-ended tuning fork-type vibrator element 7 as shown in FIGS. 14 and 15. In FIGS. 14 and 15, the illustration of the electrodes is omitted. The double-ended tuning fork-type vibrator element 7 has a pair of base portions 711, 712 and a first vibrating arm 72 and a second vibrating arm 73 coupling the base portions 711, 712. The first vibrating arm 72 and the second vibrating arm 73 have a first surface 7A and a second surface 7B in a front-back relationship. Further, the first vibrating arm 72 and the second vibrating arm 73 have first grooves 721, 731 having bottoms and respectively opening in the first surface 7A and first bank portions 725, 735 defining the first grooves 721, 731.

1.3.2. Second Modified Example

Figure 16:
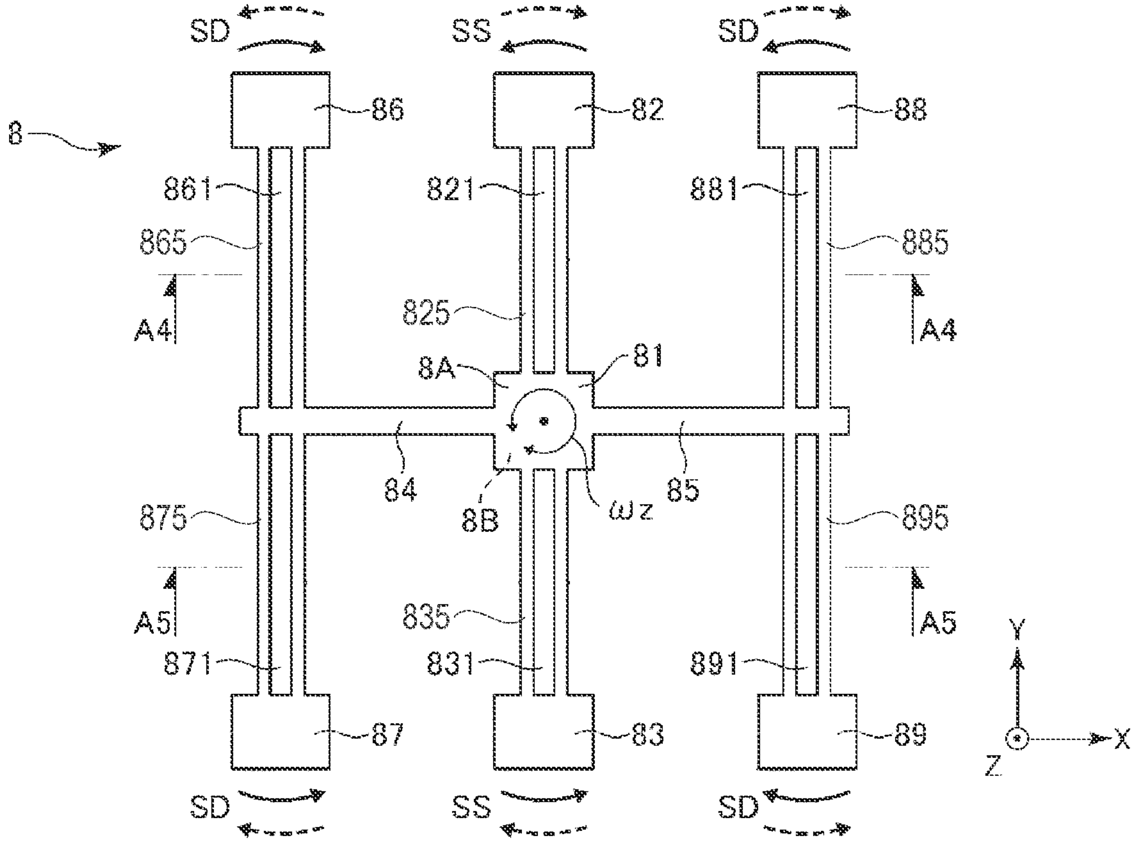
FIG. 16 is a plan view showing a second modified example of the vibrator element.
Figure 17:
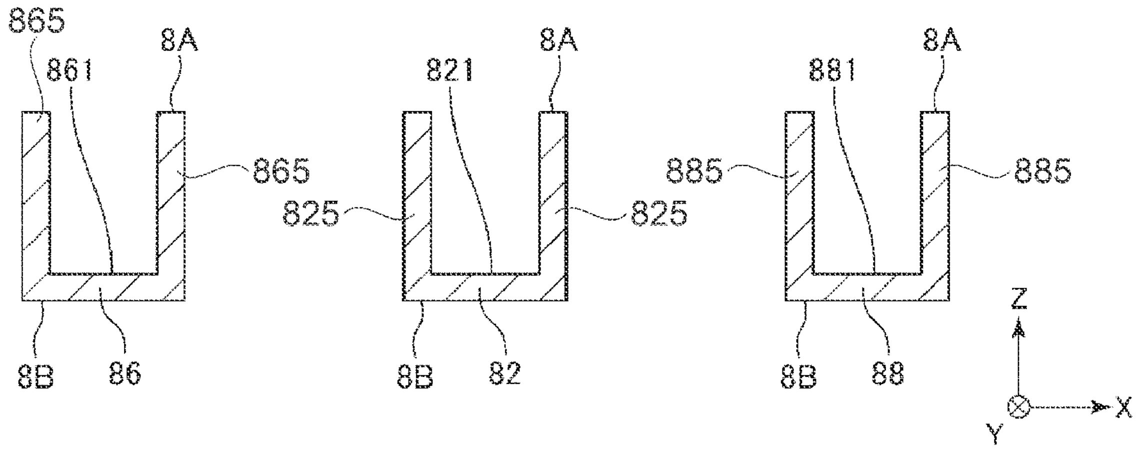
FIG. 17 is a sectional view along line A4-A4 in FIG. 16.
Figure 18:
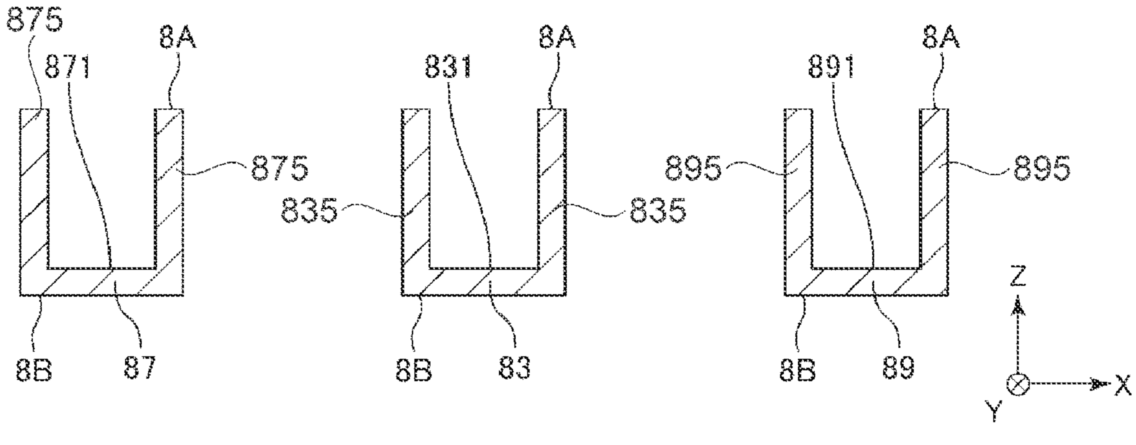
FIG. 18 is a sectional view along line A5-A5 in FIG. 16.

A vibrator element of a second modified example may be e.g., a gyro vibrator element 8 as shown in FIGS. 16, 17, and 18. In FIGS. 16, 17, and 18, the illustration of the electrodes is omitted. The gyro vibrator element 8 has a base portion 81, a pair of detection vibration arms 82, 83 extending from the base portion 81 toward both sides in the Y direction, a pair of coupling arms 84, 85 extending from the base portion 81 toward both sides in the X direction, drive vibration arms 86, 87 extending from an end portion of the coupling arm 84 toward both sides in the Y direction, and drive vibration arms 88, 89 extending from an end portion of the coupling arm 85 toward both sides in the Y direction. In the gyro vibrator element 8, when the drive vibration arms 86, 87, 88, 89 are flexurally vibrated in arrow SD directions in FIG. 16 and an angular velocity ωz around the Z-axis acts thereon, flexural vibrations in arrow SS directions are newly excited in the detection vibration arms 82, 83 by the Coriolis force, and the angular velocity ωz is detected based on electric charge output from the detection vibration arms 82, 83 by the flexural vibrations.

The detection vibration arms 82, 83 and the drive vibration arms 86, 87, 88, 89 have a first surface 8A and a second surface 8B in a front-back relationship. The detection vibration arms 82, 83 have first grooves 821, 831 having bottoms and opening in the first surface 8A and first bank portions 825, 835 defining the first grooves 821, 831. The drive vibration arms 86, 87, 88, 89 have first grooves 861, 871, 881, 891 having bottoms and opening in the first surface 8A and first bank portions 865, 875, 885, 895 defining the first grooves 861, 871, 881, 891. In the gyro vibrator element 8, for example, the drive vibration arms 86, 88 or the drive vibration arms 87, 89 are the first vibrating arm and the second vibrating arm.

1.3.3. Third Modified Example

Figure 19:
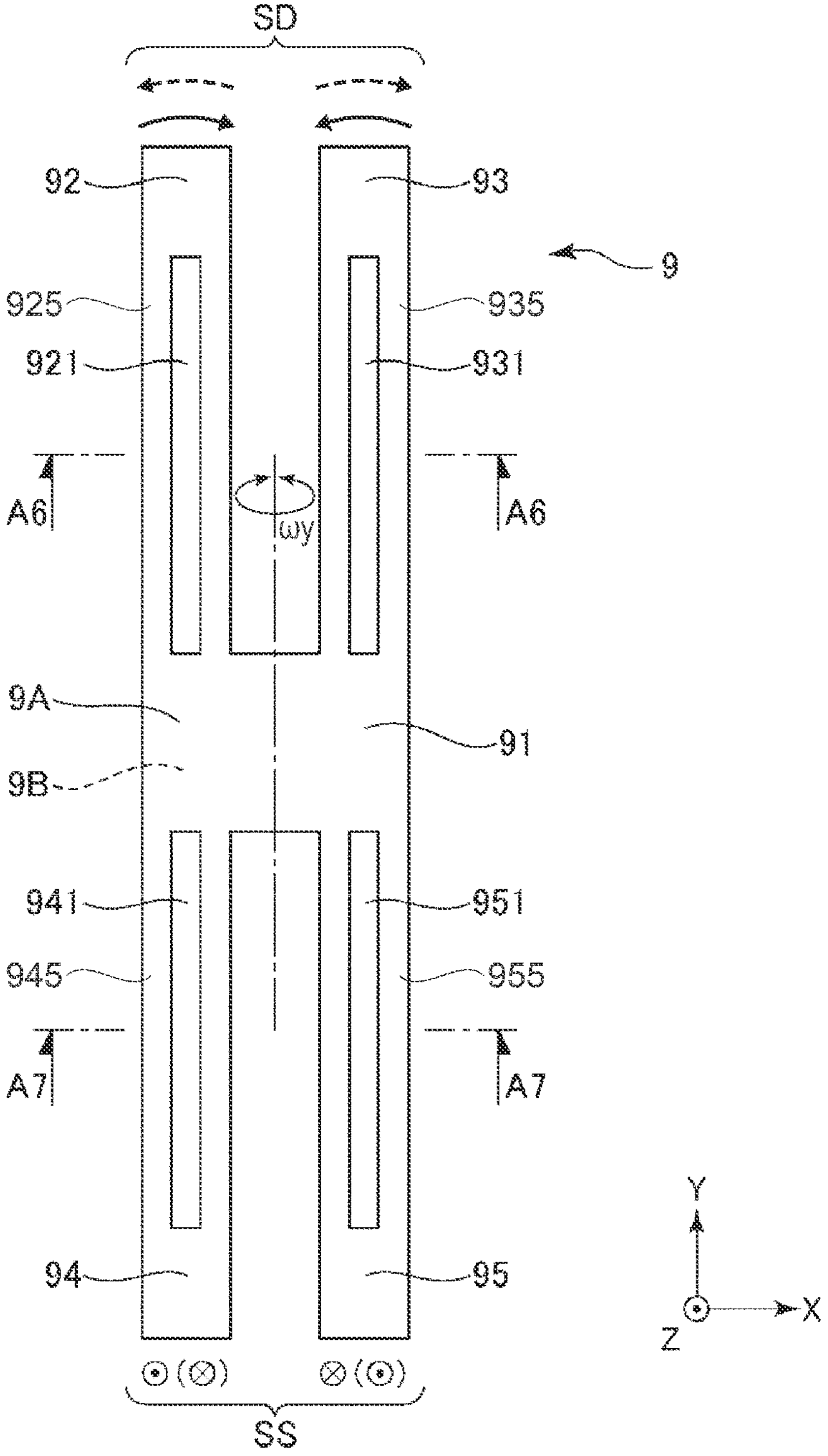
FIG. 19 is a plan view showing a third modified example of the vibrator element.
Figure 20:
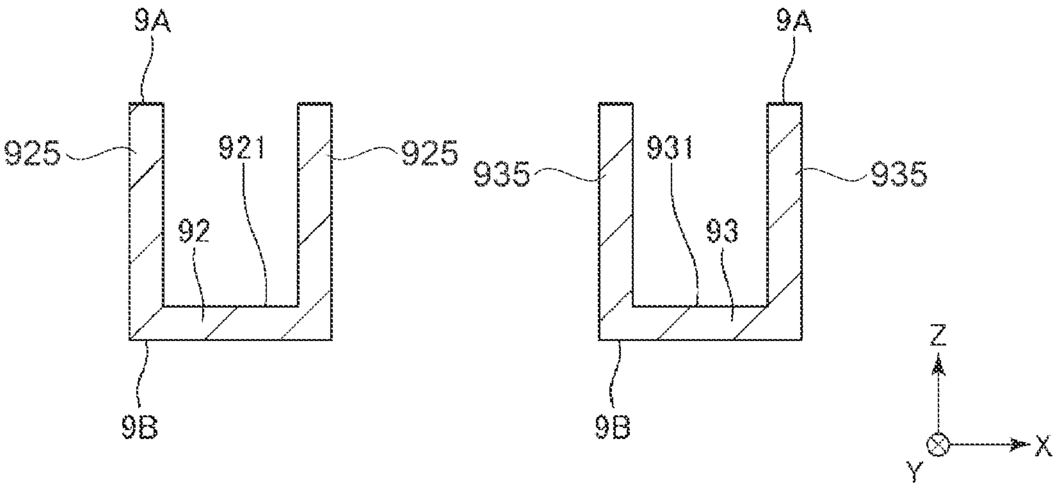
FIG. 20 is a sectional view along line A6-A6 in FIG. 19.
Figure 21:
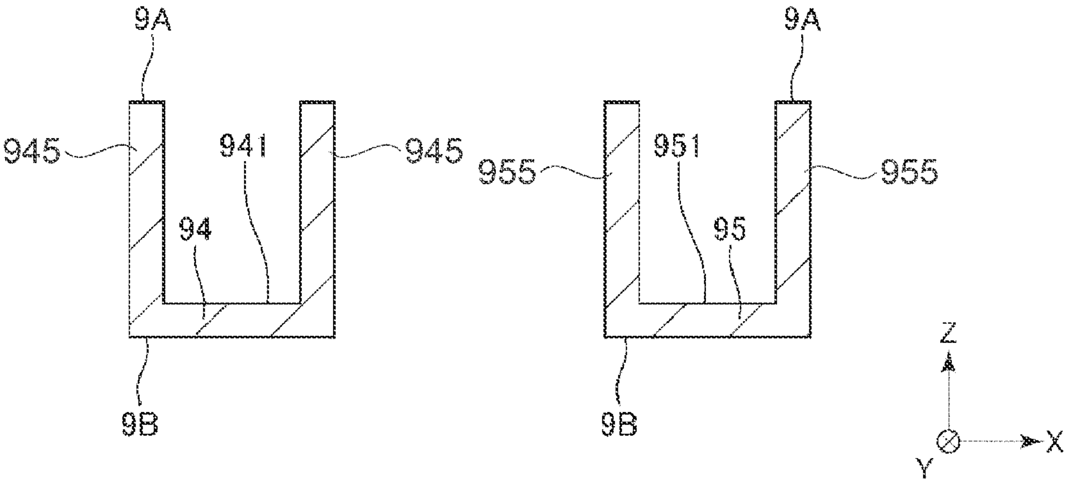
FIG. 21 is a sectional view along line A7-A7 in FIG. 19.

A vibrator element of a third modified example may be e.g., a gyro vibrator element 9 as shown in FIGS. 19, 20, and 21. In FIGS. 19, 20, and 21, the illustration of the electrodes is omitted. The gyro vibrator element 9 has a base portion 91, a pair of drive vibration arms 92, 93 extending from the base portion 91 toward the plus side in the Y direction and arranged in the X direction and a pair of detection vibration arms 94, 95 extending from the base portion 91 toward the minus side in the Y direction and arranged in the X direction. In the gyro vibrator element 9, when the drive vibration arms 92, 93 are flexurally vibrated in arrow SD directions in FIG. 19 and an angular velocity ωy around the Y-axis acts thereon, flexural vibrations in arrow SS directions are newly excited in the detection vibration arms 94, 95 by the Coriolis force, and the angular velocity ωy is detected based on electric charge output from the detection vibration arms 94, 95 by the flexural vibrations.

The drive vibration arms 92, 93 and the detection vibration arms 94, 95 have a first surface 9A and a second surface 9B in a front-back relationship. The drive vibration arms 92, 93 have first grooves 921, 931 having bottoms and opening in the first surface 9A and first bank portions 925, 935 defining the first grooves 921, 931. The detection vibration arms 94, 95 have first grooves 941, 951 having bottoms and opening in the first surface 9A and first bank portions 945, 955 defining the first grooves 941, 951. In the gyro vibrator element 9, for example, the drive vibration arms 92, 93 or the detection vibration arms 94, 95 are the first vibrating arm and the second vibrating arm.

2. Second Embodiment

Next, a manufacturing method for a vibrator element 1*a* according to a second embodiment is explained. First, a configuration of the vibrator element 1*a* is explained with reference to FIGS. 22 and 23, and then, the manufacturing method for the vibrator element 1*a* is explained with reference to FIGS. 24 to 31. The same configurations as those of the first embodiment have the same signs and the overlapping explanation will be omitted.

The vibrator element 1*a* of the embodiment is the same as the vibrator element 1 of the first embodiment except that second grooves 222, 232 having bottoms and opening in the second surface 2B and second bank portions 226, 236 defining the second grooves 222, 232 are provided. Note that the embodiment will be explained with a focus on differences from the above described first embodiment and the explanation of the same items will be omitted. Further, the manufacturing method for the vibrator element 1*a* of the embodiment is the same as the manufacturing method for the vibrator element 1 of the first embodiment except that the first grooves 221, 231 are formed at the first surface 2A side, and then, the second grooves 222, 232 are formed at the second surface 2B side.

2.1. Vibrator Element

Figure 22:
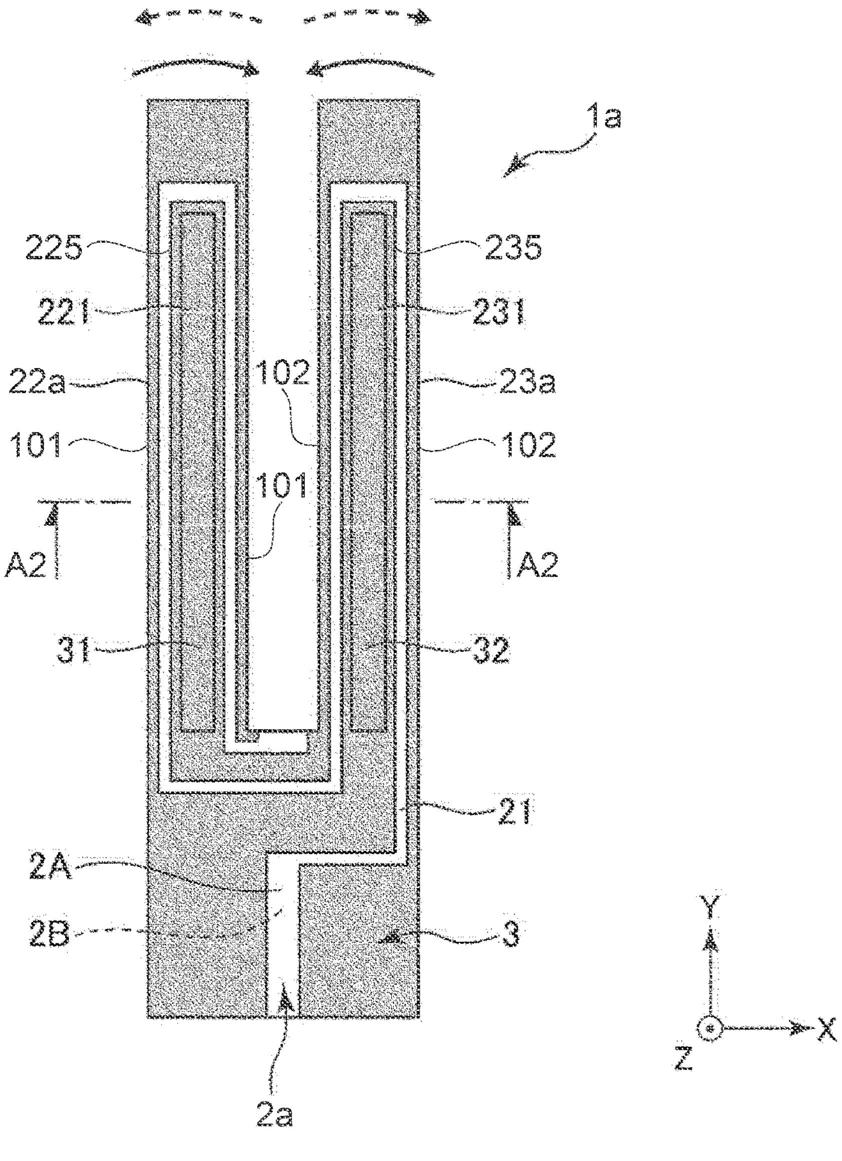
FIG. 22 is a plan view showing a configuration of a vibrator element according to a second embodiment.
Figure 23:
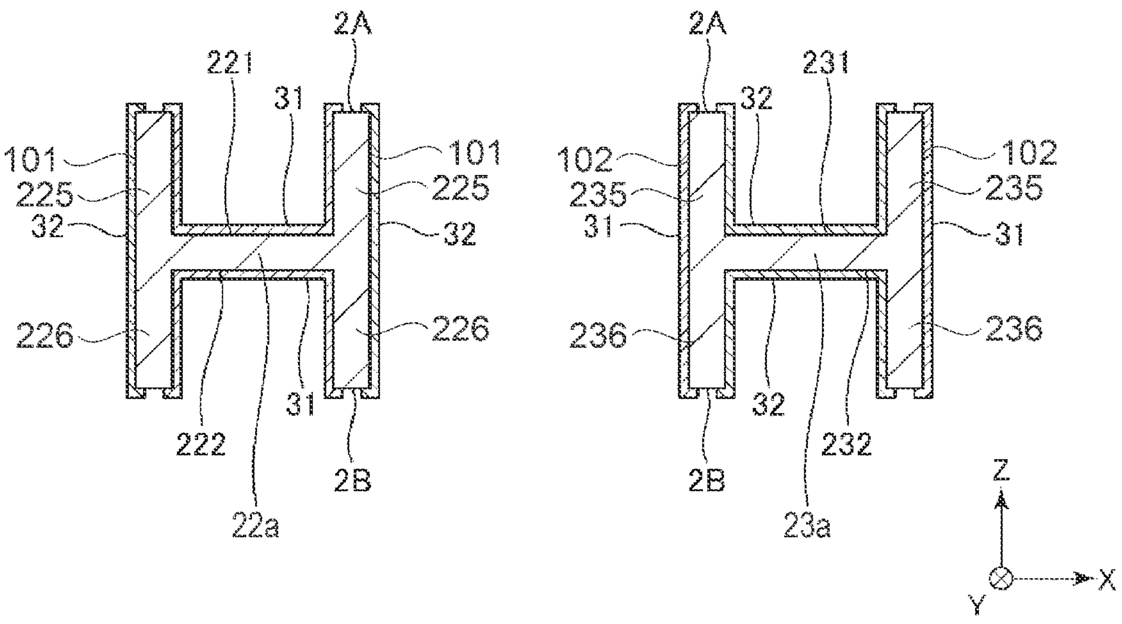
FIG. 23 is a sectional view along line A2-A2 in FIG. 22.

As shown in FIGS. 22 and 23, the vibrator element 1*a* of the embodiment is a tuning fork-type vibrator element and has a vibrating substrate 2*a* and the electrode 3 formed on the surface of the vibrating substrate 2*a*.

The vibrating substrate 2*a* is formed by patterning of a Z cut quartz crystal substrate in a desired shape, has a breadth along the XY-plane defined by the X-axis and the Y-axis as crystal axes of the quartz crystal, and has a thickness along the Z direction.

The vibrating substrate 2*a* has a plate-like shape and has the first surface 2A and the second surface 2B in the front-back relationship with each other and arranged in the Z direction. Further, the vibrating substrate 2*a* has the base portion 21, and a first vibrating arm 22*a* and a second vibrating arm 23*a* extending from the base portion 21 along the Y direction as the first direction and arranged along the X direction as the second direction crossing the first direction.

The first vibrating arm 22*a* has the first groove 221 having the bottom and opening in the first surface 2A, the first bank portions 225 defining the first groove 221, the second groove 222 having a bottom and opening in the second surface 2B, the second bank portions 226 defining the second groove 222, and the side surfaces 101 coupling the first surface 2A and the second surface 2B.

Similarly, the second vibrating arm 23*a* has the first groove 231 having the bottom and opening in the first surface 2A, the first bank portions 235 defining the first groove 231, the second groove 232 having a bottom and opening in the second surface 2B, the second bank portions 236 defining the second groove 222, and the side surfaces 102 coupling the first surface 2A and the second surface 2B.

The first grooves 221, 231 and the second grooves 222, 232 respectively extend along the Y direction. Further, the first bank portions 225, 235 and the second bank portions 226, 236 are respectively formed on both sides in the X direction of the first grooves 221, 231 and the second grooves 222, 232 and extend along the Y direction. Therefore, the first vibrating arm 22*a* and the second vibrating arm 23*a* respectively have cross-sectional shapes substantially in U-shapes. Thereby, the vibrator element 1*a* having a reduced thermoelastic loss and excellent vibration characteristics is obtained.

The electrode 3 has the signal electrodes 31 and the ground electrodes 32. The signal electrodes 31 are placed on the first surface 2A and the second surface 2B of the first vibrating arm 22*a* and the side surfaces 102 of the second vibrating arm 23*a*. On the other hand, the ground electrodes 32 are placed on the side surfaces 101 of the first vibrating arm 22*a* and the first surface 2A and the second surface 2B of the second vibrating arm 23. When drive signals are applied to the signal electrodes 31 with the ground electrodes 32 grounded, as shown by arrows in FIG. 22, the first vibrating arm 22*a* and the second vibrating arm 23*a* flexurally vibrate in the X direction to be repeatedly closer to and away from each other.

2.2. Manufacturing Method for Vibrator Element

Next, the manufacturing method for the vibrator element 1*a* is explained. As shown in FIG. 24, the manufacturing method for the vibrator element 1*a* includes a preparation step S11, a first foundation film formation step S12, a first protective film formation step S13, a second protective film formation step S14, a first dry etching step S15, a second protective film removal step S16, a second foundation film formation step S17, a third protective film formation step S18, a fourth protective film formation step S19, a second dry etching step S20, a fourth protective film formation step S21, and an electrode formation step S22.

The preparation step S11 to the second protective film formation step S14 are the same as those of the first embodiment and the explanation thereof will be omitted and the explanation will be made from the first dry etching step S15.

2.2.1. First Dry Etching Step S15

Figure 25:
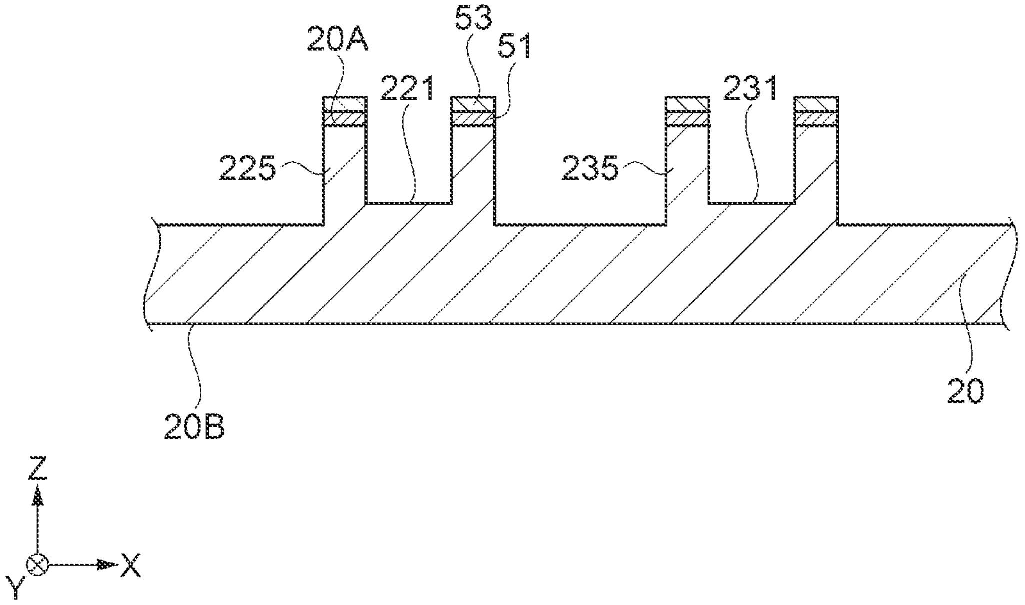
FIG. 25 is a sectional view for explanation of the manufacturing method for the vibrator element.

As shown in FIG. 25, the dry etching is ended with the second protective film 53 left. Note that, at the end of the dry etching, the quartz crystal substrate 20 in the inter-arm areas Q4 and the inter-element areas Q5 is etched to have substantially a half of the thickness before etching. Further, the first grooves 221, 231 in the first groove formation areas Q1 are etched to desired depths from the first substrate surface 20A. Therefore, the first groove 221 and the first bank portion 225 forming the first vibrating arm 22*a* are formed and the first groove 231 and the first bank portion 235 forming the second vibrating arm 23*a* are formed.

2.2.2. Second Projective Film Removable Step S16

Figure 26:
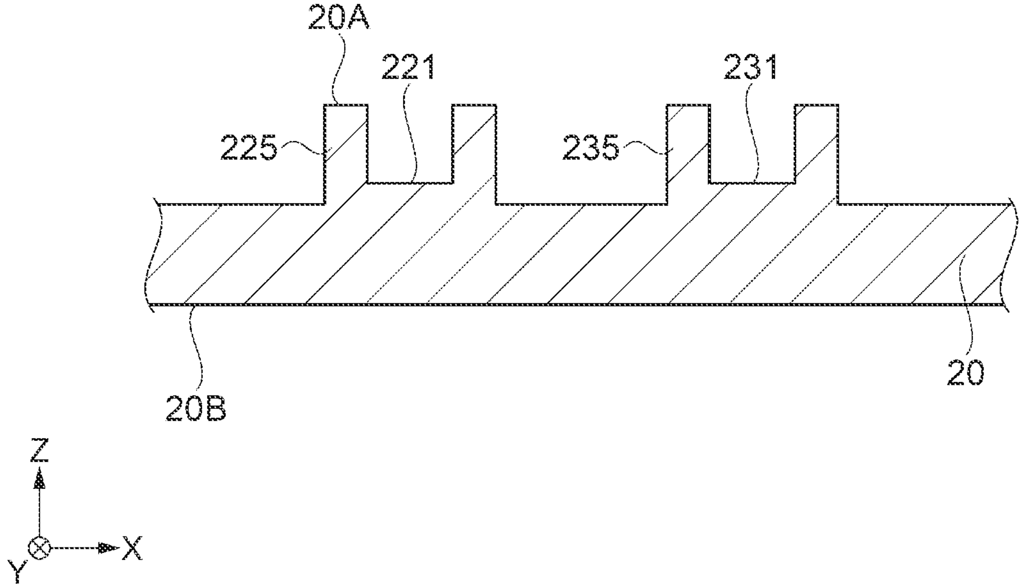
FIG. 26 is a sectional view for explanation of the manufacturing method for the vibrator element.

Then, as shown in FIG. 26, the second protective film 53 and the foundation film 51 left on the first substrate surface 20A of the quartz crystal substrate 20 in the first bank portion formation areas Qd1 are removed.

2.2.3. Second Foundation Film Formation Step S17

Figure 27:
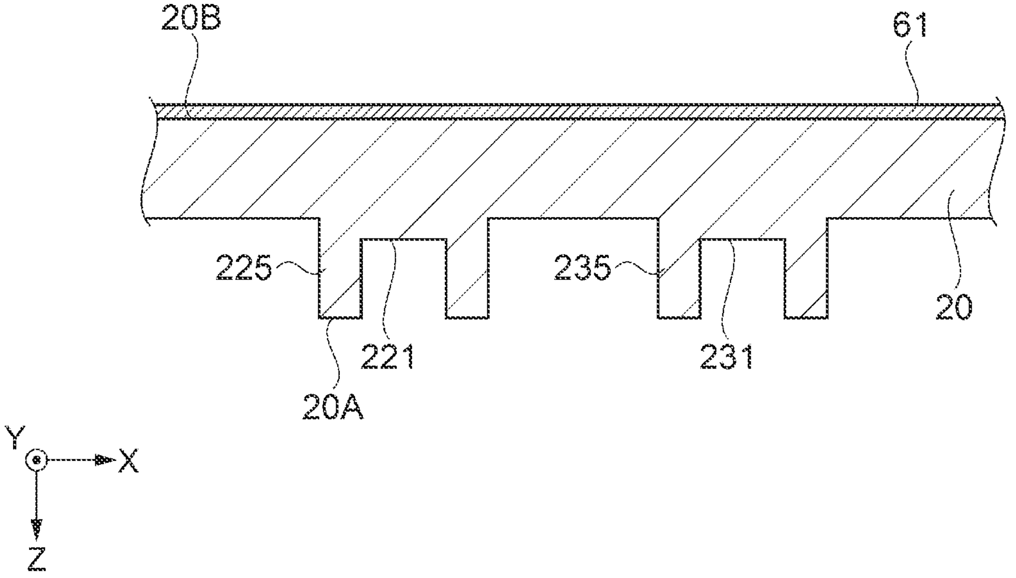
FIG. 27 is a sectional view for explanation of the manufacturing method for the vibrator element.

Then, as shown in FIG. 27, a foundation film 61 as a metal material such as chromium (Cr) is formed on the on the second surface 2B of the vibrating substrate 2*a*. Note that the thickness of the foundation film 61 is smaller than thicknesses of a third protective film 62 and a fourth protective film 63, which will be described later. Further, in the embodiment, the foundation film 61 is formed only on the second substrate surface 20B of the vibrating substrate 2*a*, however, may be formed on the first substrate surface 20A and the side surfaces of the vibrating substrate 2*a* and inner surfaces of the first grooves 221, 231.

2.2.4. Third Protective Film Formation Step S18

The third protective film 62 as a resin material such as a resist is formed on the foundation film 61 formed on the second substrate surface 20B of the quartz crystal substrate 20. Note that the third protective film formation step S18 includes an application step of applying the third protective film 62, an exposure step exposing the third protective film 62 to light, and a development step of developing the third protective film 62 exposed to light.

The third protective film formation step S18 is the same as the first protective film formation step S3 of the first embodiment and the explanation thereof will be omitted.

2.2.5. Fourth Protective Film Formation Step S19

Figure 28:
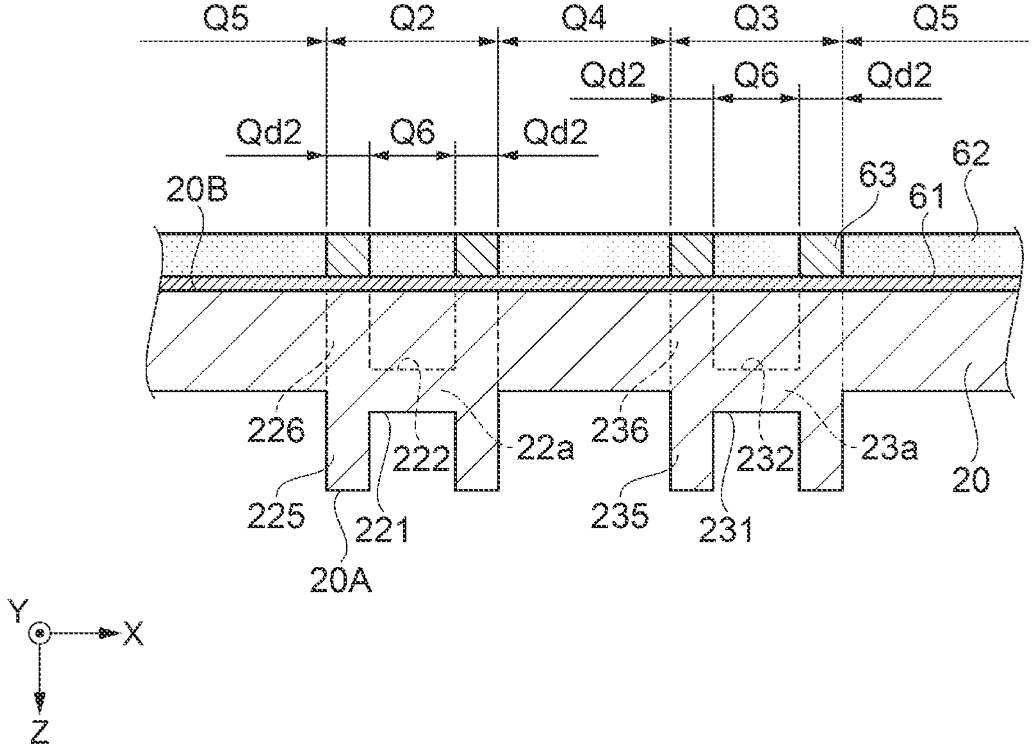
FIG. 28 is a sectional view for explanation of the manufacturing method for the vibrator element.

Then, as shown in FIG. 28, the fourth protective film 63 as a metal material such as copper (Cu) or nickel (Ni) is formed by plating in second bank portion formation areas Qd2 with the third protective film 62 removed. Note that, as a method of forming the fourth protective film 63, e.g., a method of depositing the fourth protective film 63 by evaporation or sputtering and forming by a photolithography technique may be used. Further, in FIG. 28, to clearly show the respective areas, the first vibrating arm 22*a*, the second vibrating arm 23*a*, the second grooves 222, 232, and the second bank portions 226, 236 in the finished vibrating substrate 2*a* are shown by broken lines.

Figure 29:
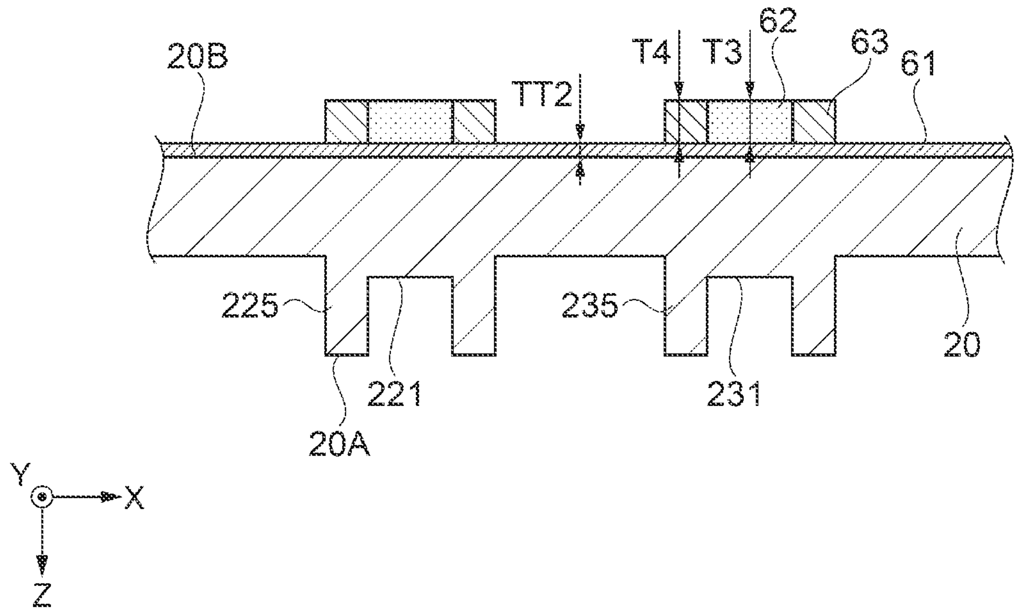
FIG. 29 is a sectional view for explanation of the manufacturing method for the vibrator element.

Then, as shown in FIG. 29, the third protective film 62 in the inter-arm areas Q4 and the inter-element areas Q5 are exposed to light, developed, and removed.

Here, an etching rate r3 of the third protective film 62 formed in second groove formation areas Q6 is larger than an etching rate r4 of the fourth protective film 63 formed in the second bank portion formation areas Qd2. That is, a relationship r3>r4 is satisfied and, at the second dry etching step S20, which will be described later, the second grooves 222, 232 and the outer shape of the vibrating substrate 2*a* may be formed at the same time.

A thickness TT2 of the foundation film 61 is smaller than a thickness T3 of the third protective film 62 and a thickness T4 of the fourth protective film 63. The thickness TT2 of the foundation film 61 is smaller, and thereby, at the second dry etching step S20 to be described later, dry etching in the inter-arm areas Q4 and the inter-element areas Q5 may be performed at the maximum speed, and the time for dry etching may be shortened. Accordingly, the time for the dry etching step may be shortened.

2.2.6. Second Dry Etching Step S20

Figure 30:
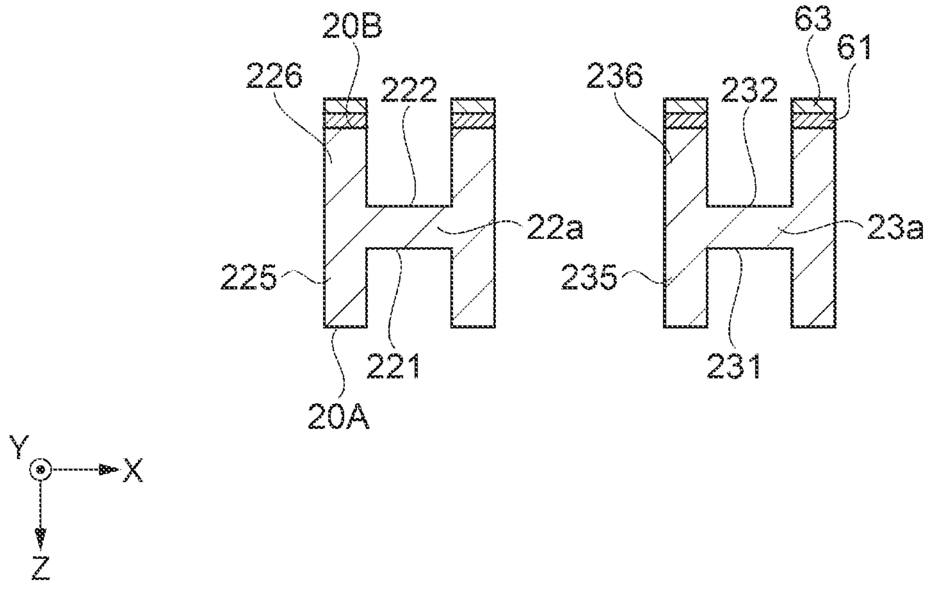
FIG. 30 is a sectional view for explanation of the manufacturing method for the vibrator element.

As shown in FIG. 30, the quartz crystal substrate 20 is dry-etched from the second substrate surface 20B side via the third protective film 62 and the fourth protective film 63 formed in the first vibrating arm formation areas Q2 and the second vibrating arm formation areas Q3, and the second grooves 222, 232 and the outer shape of the vibrating substrate 2*a* are formed at the same time. The outer shape of the vibrating substrate 2*a* includes outer shapes of the first vibrating arm 22*a* and the second vibrating arm 23*a*.

Note that, as shown in FIG. 30, the dry etching is ended with the fourth protective film 63 left.

2.2.7. Fourth Protective Film Removal Step S21

Figure 31:
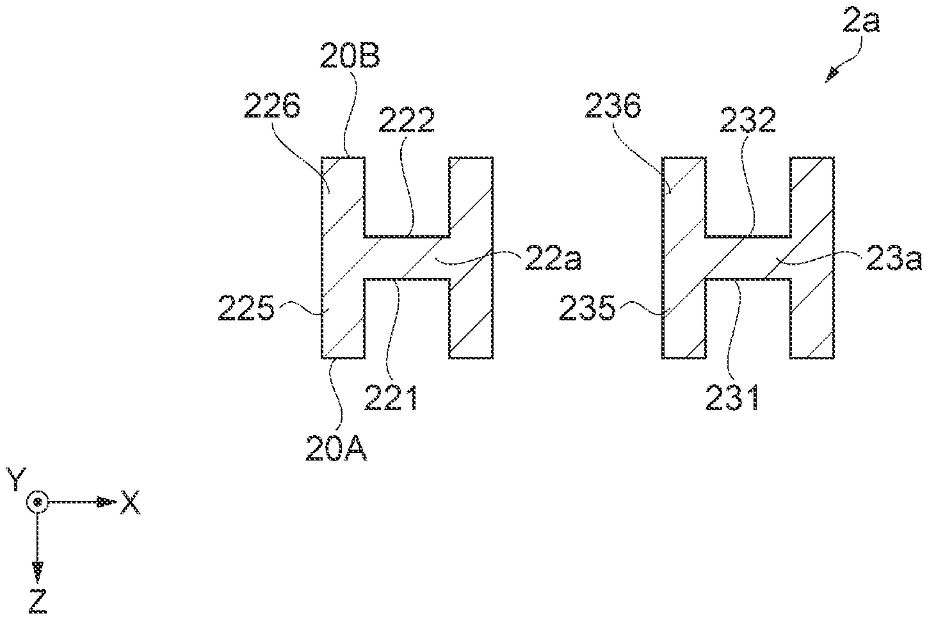
FIG. 31 is a sectional view for explanation of the manufacturing method for the vibrator element.

As shown in FIG. 31, the fourth protective film 63 and the foundation film 61 left on the second substrate surface 20B of the quartz crystal substrate 20 in the second bank portion formation areas Qd2 are removed. Thereby, the second substrate surface 20B of the quartz crystal substrate 20 becomes the second surfaces 2B of the first vibrating arm 22*a* and the second vibrating arm 23*a*. The second surfaces 2B of the first vibrating arm 22*a* and the second vibrating arm 23*a* are not etched at the second dry etching step S20, and the thicknesses of the first vibrating arm 22*a* and the second vibrating arm 23*a* in the second bank portion formation areas Qd2 and the surface roughness of the second surfaces 2B are maintained without change from the thickness of the quartz crystal substrate 20 and the surface roughness of the second substrate surface 20B. Accordingly, the thickness accuracy of the first vibrating arm 22*a* and the second vibrating arm 23*a* is increased and unnecessary vibration including torsional vibration may be suppressed.

2.2.8. Electrode Formation Step S22

A metal film is deposited on the surface of the vibrating substrate 2*a* and the metal film is patterned, and thereby, the electrode 3 is formed.

In the above described manner, the vibrator element 1*a* of the embodiment is obtained.

Note that, in the embodiment, the third protective film 62 is the resin material and the fourth protective film 63 is the metal material, however, the third protective film 62 and the fourth protective film 63 may be formed of resin materials. Or, the third protective film 62 and the fourth protective film 63 may be formed of metal materials. When one of the third protective film 62 and the fourth protective film 63 is formed of a resin material, the other may be formed of a metal material. Note that it is necessary to satisfy the relationship r3>r4 when the etching rate of the third protective film 62 is r3 and the etching rate of the fourth protective film 63 is r4.

As described above, in the manufacturing method for the vibrator element 1*a* of the embodiment, the first grooves 221, 231 and the first bank portions 225, 235 are formed at the first substrate surface 20A side of the quartz crystal substrate 20, then, the third protective film 62 having the larger etching rate than the fourth protective film 63 is placed in the second groove formation areas Q6 and the fourth protective film 63 is placed in the second bank portion formation areas Qd2 at the second substrate surface 20B side, and thereby, at the second dry etching step S20, the outer shape of the vibrating substrate 2*a* including the first vibrating arm 22*a* and the second vibrating arm 23*a*, the first grooves 221, 231, and the second grooves 222, 232 may be collectively formed without using the micro-loading effect and the manufacturing method for the vibrator element 1*a* having a higher degree of freedom of design may be provided.

What is claimed is:

1. A manufacturing method for a vibrator element including a first vibrating arm and a second vibrating arm extending along a first direction and arranged along a second direction crossing the first direction, the first vibrating arm and the second vibrating arm respectively having a first surface and a second surface along the first direction and the second direction in a front-back relationship and first grooves having bottoms and opening in the first surface, comprising:

a preparation step of preparing a quartz crystal substrate having a first substrate surface and a second substrate surface in a front-back relationship;

a first protective film formation step of forming a first protective film in first groove formation areas where the first grooves are formed of the first substrate surface;

a second protective film formation step of forming a second protective film in an area except the first groove formation areas of a first vibrating arm formation area where the first vibrating arm is formed and a second vibrating arm formation area where the second vibrating arm is formed of the first substrate surface; and a first dry etching step of dry etching the quartz crystal substrate from the first substrate surface side via the first protective film and the second protective film and forming the first surface, the first grooves, and outer shapes of the first vibrating arm and the second vibrating arm, wherein r1>r2, where an etching rate of the first protective film is r1 and an etching rate of the second protective film is r2.

2. The manufacturing method for a vibrator element according to claim 1, further comprising a first foundation film formation step of forming a foundation film on the first substrate surface before the first protective film formation step, wherein a thickness of the foundation film is smaller than thicknesses of the first protective film and the second protective film.

3. The manufacturing method for a vibrator element according to claim 1, wherein the first protective film formation step includes an application step of applying the first protective film onto the first substrate surface, an exposure step of exposing the first protective film to light, and a development step of developing the first protective film.

4. The manufacturing method for a vibrator element according to claim 1, wherein at the first dry etching step, the dry etching is ended with the second protective film left, and a second protective film removal step of removing the left second protective film is further provided.

5. The manufacturing method for a vibrator element according to claim 1, wherein the first protective film and the second protective film are formed of resin materials.

6. The manufacturing method for a vibrator element according to claim 1, wherein the first protective film and the second protective film are formed of metal materials.

7. The manufacturing method for a vibrator element according to claim 1, wherein when one of the first protective film and the second protective film is formed of a resin material, the other is formed of a metal material.

8. The manufacturing method for a vibrator element according to claim 1, wherein the vibrator element further has second grooves having bottoms and opening in the second surface, and after the first dry etching step, a third protective film formation step of forming a third protective film in second groove formation areas where the second grooves are formed of the second substrate surface, a fourth protective film formation step of forming a fourth protective film in an area except the second groove formation areas of the first vibrating arm formation area where the first vibrating arm is formed and the second vibrating arm formation area where the second vibrating arm is formed of the second substrate surface, and a second dry etching step of dry etching the quartz crystal substrate from the second substrate surface side via the third protective film and the fourth protective film and forming the second surface, the second grooves, and outer shapes of the first vibrating arm and the second vibrating arm are provided, and r3>r4, where an etching rate of the third protective film is r3 and an etching rate of the fourth protective film is r4.

9. The manufacturing method for a vibrator element according to claim 8, further comprising a second foundation film formation step of forming a foundation film on the second substrate surface before the third protective film formation step, wherein a thickness of the foundation film is smaller than thicknesses of the third protective film and the fourth protective film.

10. The manufacturing method for a vibrator element according to claim 8, wherein the third protective film formation step includes an application step of applying the third protective film onto the second substrate surface, an exposure step of exposing the third protective film to light, and a development step of developing the third protective film.

11. The manufacturing method for a vibrator element according to claim 8, wherein at the second dry etching step, the dry etching is ended with the fourth protective film left, and a fourth protective film removal step of removing the left fourth protective film is further provided.

12. The manufacturing method for a vibrator element according to claim 8, wherein the third protective film and the fourth protective film are formed of resin materials.

13. The manufacturing method for a vibrator element according to claim 8, wherein the third protective film and the fourth protective film are formed of metal materials.

14. The manufacturing method for a vibrator element according to claim 8, wherein when one of the third protective film and the fourth protective film is formed of a resin material, the other is formed of a metal material.

* * * * *